United States Patent [19]

Grudkowski

[11] Patent Number: 5,243,307
[45] Date of Patent: Sep. 7, 1993

[54] ACT DEVICE HAVING OPTICAL CONTROL OF SAW VELOCITY

[75] Inventor: Thomas W. Grudkowski, Glastonbury, Conn.

[73] Assignee: United Technologies Corporation, Hartford, Conn.

[21] Appl. No.: 658,824

[22] Filed: Feb. 22, 1991

[51] Int. Cl.⁵ .................. H03H 9/42; H01L 41/08; H01L 29/96

[52] U.S. Cl. .................................. 333/152; 333/165; 310/313 R; 257/245

[58] Field of Search ................. 333/150–154, 333/165; 310/313 R, 313 B, 313 C, 313 D; 357/24; 257/245

[56] References Cited

U.S. PATENT DOCUMENTS

| | | | |
|---|---|---|---|
| 3,706,055 | 12/1972 | Dieulesaint et al. | 333/152 |
| 4,025,954 | 5/1977 | Bert | 333/153 X |
| 4,620,167 | 10/1986 | Brooks et al. | 333/153 X |
| 4,633,285 | 12/1986 | Hunsinger et al. | 357/24 LR X |
| 4,926,083 | 5/1990 | Merritt et al. | 310/313 R |
| 4,980,596 | 12/1990 | Sacks et al. | 310/313 D |
| 5,034,793 | 7/1991 | Malocha et al. | 333/165 X |

OTHER PUBLICATIONS

Crowley, J. D. et al; "Acoustoelectrically controlled SAW power divider" *1977 Ultrasonics Symposium Proceeding;* Phoenix Ariz. Oct. 26–28, 1977; pp. 633–636.

*Primary Examiner*—Robert J. Pascal
*Assistant Examiner*—Benny Lee
*Attorney, Agent, or Firm*—Gerald L. DePardo; Eric W. Petraske

[57] ABSTRACT

A high speed analog to digital converter system employs a set of ACT devices in parallel to buffer a high speed data sampling rate to the processing rate of the analog to digital converters employed. Vernier control of phase between individual devices is maintained by controlling the speed of propagation of the SAW wave by illumination of the substrate in response to a phase comparison between the SAW and a reference signal.

9 Claims, 2 Drawing Sheets

ACT DEVICE HAVING OPTICAL CONTROL OF SAW VELOCITY

CROSS REFERENCE TO RELATED APPLICATIONS

This application is related to the subject matter disclosed and claimed in copending U.S. Ser. No. 07/658,825 entitled Acoustic Charge Transport Memory Device by Thomas W. Grudkowski, and U.S. Ser. No. 07/661,268, issued Apr. 21, 1992 as U.S. Pat. No. 5,107,310, entitled ACT Device with Buffer Channel by Thomas W. Grudkowski and Eric W. Petraske filed on even date herewith and assigned to the same assignee herein incorporated by reference.

TECHNICAL FIELD

The field of the invention is that of surface acoustic wave (SAW) data processing systems, especially ACT (acoustic charge transport) or HACT (heterojunction acoustic charge transport), generally referred to as ACT devices, in which phase consistency between a number of parallel channels must be maintained; in particular fast analog to digital (A/D) conversion or other coherent rf processing.

BACKGROUND ART

In signal processing systems in which a number of devices operate on the input data, there arises the need to maintain the relative phases between a number of parallel signal processing channels. Conventional phase shifting circuits operating on the raw data before it enters the devices have been used, but differences within the processing devices are then not compensated.

In the case where the processing devices employ SAWs, the difficulty in the prior art referred to above is compounded because SAW devices depend on temperature, stress on the device, etc., so that there are interchannel differences that must be compensated. In addition to coarse control of the relative phase, vernier control is also required in high accuracy digital applications.

DISCLOSURE OF INVENTION

The invention relates to an improved parallel channel ACT/HACT system, in which the input signal is sampled by storage within an acoustic charge transport memory device. Consistency of sampling is accomplished by applying phase shifts to the SAW, so that samples are taken at the same point on the incoming waveform. The phase shifts are produced by illuminating the surface of the device with light having photon energy above the bandgap energy.

Other features and advantages will be apparent form the specification and claims and from the accompanying drawings which illustrate an embodiment of the invention.

BEST MODE FOR CARRYING OUT THE INVENTION

Figure 1:
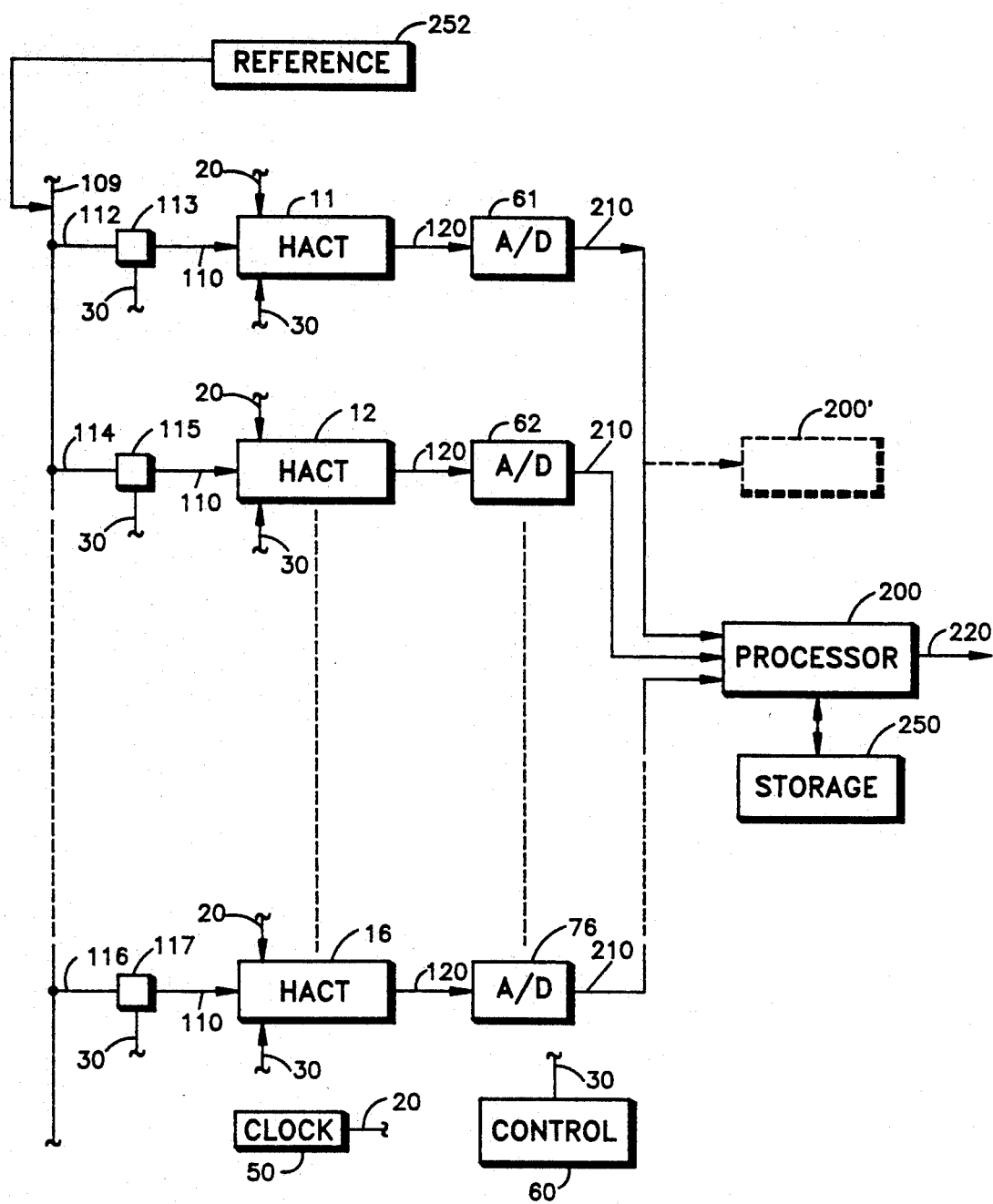
FIG. 1 illustrates in schematic form an embodiment of the invention.

In the course of the analog to digital conversion of a high speed input signal or other coherent rf processing, the signal enters a system on line 109 at the left of FIG. 1 and passes downwardly. A series of ACT (or in the preferred embodiment HACT, standing for heterojunction acoustic charge transport) devices 11, 12 and 16, illustratively formed on GaAs substrates as shown in U.S. Pat. No. 4,893,161, sample portions of the incoming signal that are tapped off on lines 112, 114 and 116. For convenience, the term HACT will be issued herein to mean both ACT and HACT devices. Line 110 may be a wire or a waveguide and lines 112 to 116 are connected in a manner that will not perturb the incoming signal, as is known to those skilled in the art in conventional practice.

An important consideration is that the input signal be sampled consistently—that samples taken by an individual unit at different times be consistent and that samples taken by different units at the same or different times also be consistent. Even in a system having only one sampling unit, it is evidently preferable that different samples have the same phase with respect to the input data signal.

Figure 2:
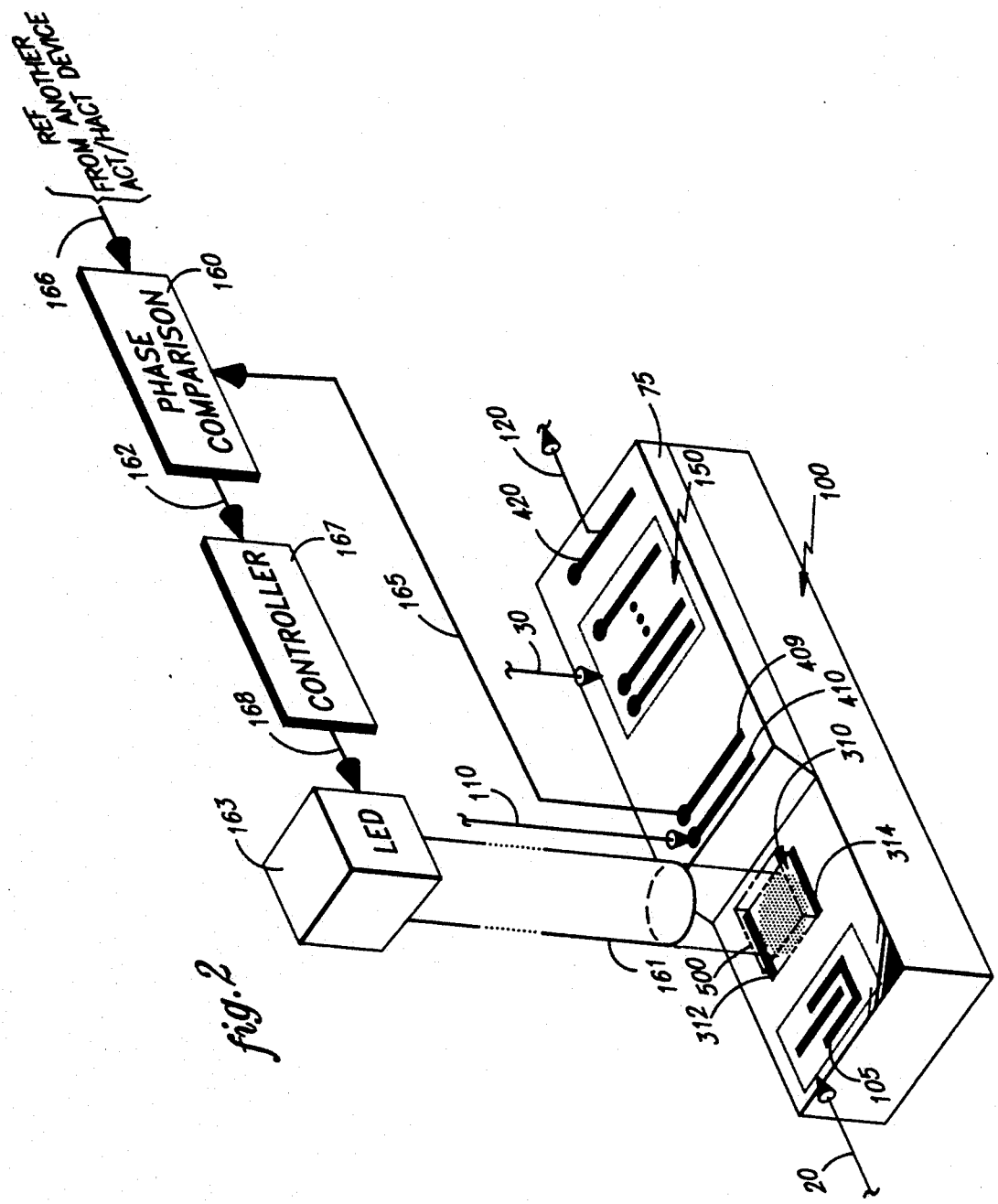
FIG. 2 illustrates, in partially schematic, partially pictorial form, a HACT device for use in the systems of FIG. 1.

An optional preprocessor module 113, 115, 117 etc. containing a conventional phase shift circuit may be inserted to apply a fixed or variable phase shift correction to the incoming signals and/or to gate the signals. The function of the phase shift is to compensate for differential phase shifts in the various signal paths into the several buffer modules. The phase shift circuits may apply a fixed phase shift that is determined during the system calibration or they may be controlled to apply a phase shift that may be periodically adjusted in response to shifts during system operation that result from environmental effects such as temperature. Appropriate calibration tests will be performed to correct for the inevitable differences between the several channels. Correction in both amplitude and phase may be applied to the digital output of the analog to digital converters or, as discussed above, to the incoming signals. The preprocessors may also include a linear gate to gate the analog signal through without distortion. The output signals from the optional preprocessor modules 113,115,117, are input signals to HACT devices 11, 12, 16 on a collection of lines 110 (FIGS. 1 and 2).

There are three major compensations that are needed to make the parallel channels uniform: equalization of the SAW velocity along the entire device, coarse phase adjustment of the sampled signal, and vernier phase adjustment of the sampled signal. The SAW velocity may need to be compensated from one chip to another, because velocities may differ because of differences in crystal cut or in material properties. The velocity may be controlled by controlling the temperature of the device and/or applying a stress to the device.

A first coarse level of phase control in a conventional phase shifting circuit may be used as described above on either the input signal and/or the signal to the SAW transducer. Conventional phase shift circuits, however, do not have the accuracy in the parts per million (ppm) range that is contemplated by the present invention. If it is desired or necessary for system considerations that the SAW phase be equal in a number of parallel channels at the point of signal sampling, then a vernier control on the SAW input signal will be necessary. Referring now to FIG. 2, a HACT device 100 capable of being used for the HACT devices 11, 12, 16 of FIG. 1, is illustrated.

Within each of the HACT devices 11, 12, 16 (FIG. 1), timing control signals enter along bus 20 from common coherent (in frequency and phase) frequency clock 50 (FIG. 1) to transducer unit 105 (FIG. 2) that initiates coherent surface acoustic waves (SAW) travelling within each of the HACT devices, and also controls the timing of other operations. The SAW within each HACT device 100, as is known and described in aforementioned U.S. Pat. No. 5,107,310 incorporated herein by reference, samples the incoming signal and collects a charge packet within a semiconductor charge transport channel that is carried along by the SAW. Current injection input electrode 410 and output electrode 420 are conventional in HACT applications. The SAW travels through HACT layers 75 (FIG. 2) or charge transport region comprising a charge transport layer (or channel) sandwiched between charge confinement layers and a cap layer disposed on the outer surface, as is known constructed according to the teachings of U.S. Pat. No. 4,893,161. The sampling rate is determined by the frequency of the SAW. A set of stored samples may be stored by the application of a holding (or blocking) potential to a set of taps 150 (or sampling electrodes) in FIG. 2 on the surface of the device, as is disclosed in the aforementioned copending patent application Ser. No. 07/658,825. This sampling operation may be performed at a very high rate, up to the gigahertz range. This frequency range is, of course, much higher than conventional analog to digital electronic systems can handle for high bit accuracy.

Referring to FIG. 1, the discrepancy in sampling and processing rate at high bit accuracy can be overcome by the use of a slow readout of the stored charge packets, so that HACT devices 11 through 16 function as FIFO (first-in, first-out) rate buffer memories. The control signals for storing the charges and releasing them sequentially are sent by controller 60 on a collection of lines labeled by the numeral 30 (FIGS. 1 and 2) which applies the control signals to the taps 150 (FIG. 2); and line 25, after "released on a line 120" insert—(FIGS. 1 and 2). Once the charges have been stored, the first one in time is released by removing the blocking potential on its corresponding sampling electrode to permit the charge to travel from buffer 11 into analog to digital converter 61. The first charge packet in HACT device 12 is released on a line 120 to pass into A/D converter 62, in parallel with the processing in converter 61. Similar processing occurs for HACT device 16 and A/D converter 76. The A/D converters 61, 62, 76 perform the standard conversion and pass the results out to bus 210, an N-bit bus having a width corresponding to the accuracy of the A/D converters. Further, control signals shown in the drawing as lines 30 (to reduce confusion) control the release of the signals onto the bus in any desired format and sequence. Separate bus lines may be used into parallel processing devices 200', etc., if desired. The processor 200 may provide a signal on a line 220 indicative of the signals on bus 210 processed in a predetermined fashion.

The stored charge packets are released sequentially at a rate of about 10 million samples per second (MSPS) equivalent to the capabilities of high speed analog to digital systems, such as the 14 bit AD1512, available from ELSIN Corporation, Sunnyvale, Calif., 94186. If the A/D converters can handle N conversions/sec and the data sampling rate must be M samples/sec, then the number of HACT buffers required is M/N. Thus, an input sampling rate of 100 MSPS would require 10 A/D converters. Bit accuracy is preserved, provided that each HACT module can sustain 14 Bit accuracy at 100 MSPS.

HACT devices 11 through 16 are controlled to accept consecutive blocks of samples. HACT 11 accepts the first 256 samples; HACT 12 accepts the next block, etc. The incoming signals pass on lines 112, 114, etc. into and through the several SAW devices until a timed blocking potential is applied to the sampling electrodes. In an alternative embodiment, a conventional linear gate is incorporated in each preprocessor 113, 115, 117 etc. or integrated within the HACT module to pass samples into the module without distortion of the signal. The samples may be rearranged in storage unit 250 to restore the time sequence.

An important problem in such a parallel system is ensuring consistency between HACT devices 11, 12, 16. Stability of the HACT sampling aperture is important for consistency. It may be provided up to the input of the HACT devices by phase shift circuits prior to the HACT input as described above. In addition to the phase shift provided by units 113, 115, 117 etc., it has been found that the phase shift of the SAW waves within the HACT samplers 11, 12, 16, may be controlled by illuminating the surface of the substrate carrying the SAW. Referring now to FIG. 2, a GaAs LED 163 or other optical source having an appropriate frequency may be used to create electronic carriers in the layer through which the SAW passes. This has been shown to slow the velocity of the SAW prior to the sampling process, and thus the relative phase between different SAWs and different modules. The mechanism of the SAW slowing is that excess electrons liberated by the illuminating radiation partially short out the fields in the SAW.

Transducer 105 is controlled by the clock signal on line 20 (FIGS. 1 and 2) to generate a SAW that travels to the right in the drawing, picking up electron charge packets from the signal on input electrode 410 and carrying them to output electrode 420. Radiation carried from GaAs LED 163 by optical fiber 161 illuminates surface 310 between the SAW transducer and the input electrode-under control of phase comparison unit 160 and controller 167.

The illuminated area is confined to be between transducer 105 and electrode 410 in order to avoid any effect of the photons on the charges in the packets that carry the data. In operation, any photons that are above the bandgap energy are used to raise electrons into the conduction band. Preferably, ohmic (or ohmic/-Schottky combinations) contact electrodes 312 and 314, connected to a bias source not shown, are used to sink and collect any excess electrons and/or holes, so as not to interfere with the signal being injected into the HACT layers 75 on the line 110. Electrodes 312 and 314 are formed by metal deposition and alloying and metal deposition for Schottky barriers, as is conventional in GaAs processing.

The illumination is absorbed throughout the bulk (tens of microns) of the material and the electronic carriers that are freed partially short out the SAW waves in the illumination region, which slows down the velocity of SAW propagation. The shorting effect is greater than that produced by a surface electrode because shorting is effected to a considerable depth by the penetration of the radiation. The SAW electric fields recover to their initial magnitude several wavelengths after the SAW leaves illumination region 310. The dimensions of area 310 are therefore set so that the SAW fields have recovered before electrode 410 is reached. The illumination must not be allowed to reach transducer 105 or the area after electrode 410. In the first case, the transducer would be shorted out and in the second case, the information in the signal would be destroyed.

An optional film 500 is shown deposited by any convenient conventional technique in the illumination area. This film may be any of a number of photoconductive materials chosen to optimize the absorption of light and creation of electronic carriers for a given optical wavelength. The material and the wavelength of the LED will be chosen together so that the photons have an energy above the work function of the material, as is known to those skilled in the art. Examples of suitable materials are Ge, ZnSe, or CdS.

The phase comparison is made between one of the HACT devices chosen as a reference and the others. Tap electrode 409, which may be placed before and/or after electrode 410, depending on whether the SAW and/or the injected charge is to be detected, picks up a SAW signal representing the SAW wave, which is carried on a line 165 to a phase comparator circuit 160. If the tap electrode 409 is before the input electrode 410, the electrode 409 senses the electric field from the SAW, and if it is after the input electrode 410, it senses the injected charge. Either way, the SAW signal on the line 165 is related to the SAW velocity. The SAW signal on the line 165 is compared within circuit 160 to a signal on line 166 from the reference to generate a signal on line a controller 167 which provides a signal on a line 168 to the to LED 163. The operation of unit 160 is conventional phase comparison producing a discriminant signal having an amplitude proportional to the phase deviation of the unit being affected. Those skilled in the art will readily be able to select any of the known phase comparison circuits and feedback circuits to bring the phase of the signal on the line 165 to match the reference phase. Either the duty cycle or the voltage of the LED 163 may be controlled to vary the number of photons per second hitting HACT device 100. Stability control for the phase loop is on the order of 10's of samples to 100÷s of samples, approximately MHz range.

Referring now to FIG. 1, in an illustrative system, amplitude consistency between channels is effected by overlapping a substantial portion of the samples in time. For example, HACT 11 may store 256 samples, of which 32 are used for comparison. The last 32 samples in HACT 11 overlap in time as nearly as possible the first 32 samples in HACT 12, etc. These overlapping samples are digitized and passed to processor 200. There, they are processed and/or stored in memory 250 and a conventional comparison is made between the overlapping signals to derive conversion constant parameters of the form $A_{12} = a A_{11} + b$, where the A are the amplitudes of corresponding digitized representations of the same signal sample and a and b are coefficients that are obtained by fitting the data. Both amplitude and phase corrections may be calculated in a straightforward fashion, well known to those skilled in the art. Since there is time overlap between adjacent blocks, 32 of the samples will be discarded or combined. For example, the last 32 samples from HACT 11 may discarded and replaced by the first 32 from HACT 12; alternate samples may be used from HACTs 11 and 12; or the average of samples from the two HACTs may be used. In the interleaved embodiment, comparison between channels may be made in a separate calibration run, or by periodically passing the same data sample into two or more buffers. For example, on every nth sample time, all HACT devices 11, 12, 16 would accept the same data. Only one of the digitized outputs would be stored and retained in the data stream being processed and the total set of outputs for that point would be used in the calibration process.

This comparison may be calculated for every input signal set of 256 points for self consistency. If desired, reference signals may be emitted from reference 251 and fed into line 110 for offline calibration. The reference may be a constant voltage or a set of constant voltages, a ramp, or any other convenient form. These reference signals will be inserted when data is not coming in, of course. Since the signals will depend on temperature, stress on the HACT chips, and a number of other variables, an important advantage of the comparison process, whether internally or through a reference, is that correction is provided for variation throughout system operation, not just for a calibration run. Conventional calibration will be performed in the initial set up, of course, but the high conversion accuracy required of state of the art applications demands that comparisons be made throughout an operating period such as by a self-calibrating feedback loop; i.e. a discriminator and control circuit seeking to equalize the phase of the waveforms.

Although the invention has been described in the context of sampling, those skilled in the art will readily appreciate that photo-control of the SAW velocity may be used to trim a SAW delay line fabricated on a piezoelectric semiconductor structure. In that case, the location of the illuminated surface would not matter. The extent of the illuminating surface would be used together with the intensity of illumination to control the magnitude of the effect. The delay time is trimmed by controlling the SAW velocity, either open-loop or in a feedback loop using any convenient reference.

The phase comparison circuit 160 (FIG. 2) may be of any convenient standard form. The output of the phase comparison 160 may be a slowly varying voltage that drives the LED 163 control the number of photons emitted or the output may be used as input for a voltage controlled oscillator (e.g., the controller 167) that pulses the LED to a duty cycle of the LED.

It should be understood that the invention is not limited to the particular embodiments shown and described herein, but that various changes and modifications may be made without departing from the spirit and scope of this novel concept as defined by the following claims.

What is claimed is:

1. A signal processing system having an ACT device with a SAW transducer for generating a SAW in response to an electical signal applied thereto, the SAW having a SAW velocity and travelling along a charge transport channel located in a charge transport region disposed above and contiguous with a piezoelectric semiconductor substrate, the SAW transducer being disposed on a surface of the substrate, the SAW also travelling in the substrate, comprising:

an input electrode disposed on a surface of said charge transport region at a first distance from said SAW transducer for allowing the injection of electrons into said charge transport channel;

a tap electrode disposed on said surface of said charge transport region at a second distance from said SAW transducer for detecting a SAW signal which has a predetermined relationship to said SAW velocity;

a light source disposed above an illumination portion of said substrate, for illuminating said illumination portion of said substrate with photons having a wavelength less than a predetermined lower wavelength and having a corresponding illumination photon energy sufficient to generate free electronic carriers in said substrate, said electronic carriers affecting said SAW velocity, and said illumination portion of said substrate being disposed on the surface of said substrate, substantially in the path of said SAW, between the SAW transducer and said input electrode; and a controlling circuit connected to said light source, for generating and applying a controlling signal to said light source to illuminate said illumination portion, whereby said controlling circuit adjusts said SAW velocity by controlling said corresponding illumination photon energy thereby controlling the generation of said electronic carriers in said substrate.

2. A system according to claim 1, in which said illumination portion of said substrate is in proximity to at least one contact electrode connected to said semiconductor material for collecting electrons from said substrate.

3. A system according to claim 1, wherein said piezoelectric semiconductor substrate has a substrate bandgap energy and said corresponding illumination photon energy is greater than said substrate bandgap energy.

4. A system according to claim 2, in which said illumination portion of said substrate is in proximity to at least one contact electrode connected to said semiconductor material for collecting electrons from said substrate.

5. A system according to claim 1, in which
said controlling circuit includes a phase comparison circuit having a first input connected to said tap electrode on said substrate and being responsive to said SAW velocity, and having a second input connected to at least one other tap electrode from at least one other ACT device, whereby said controlling circuit controls said light source which controls said SAW velocity in response to said phase comparison circuit.

6. A system according to claim 5, in which said illumination portion of said substrate is in proximity to at least one contact electrode connected to said substrate for collecting electrodes from said substrate.

7. A system according to claim 5, in which said illumination portion of said substrate is disposed between two contact electrodes connected to said substrate for collecting electrons from said substrate.

8. A system according to any of claims 1, 3, 2, 4, 5, 6 or 7, further comprising a layer of photoconductive material disposed above said illumination portion of said substrate and in electrical contact therewith, for efficiently generating said electronic carriers in response to said photons, said corresponding illumination photon energy being above a work function characteristic of said photoconductive material.

9. A system according to claim 1, wherein said second distance of said tap electrode is greater than said first distance of said input electrode.

* * * * *

UNITED STATES PATENT AND TRADEMARK OFFICE
CERTIFICATE OF CORRECTION

PATENT NO. : 5,243,307

DATED : September 7, 1993

INVENTOR(S) : Thomas W. Grudkowski

It is certified that error appears in the above-identified patent and that said Letters Patent is hereby corrected as shown below:

In Column 1, line 13, after "5,107,310" delete ".".
In Column 2, line 14, after "Line" delete "110" and insert --109--;
           line 69, "Refer-" should start new paragraph.
In Column 3, line 8, change "(SAW)" to read --(SAWs)--;
           line 22, after "known" insert --,--;
           line 42, after "(FIG. 2)" delete ", and line 25, after 'released on a line 120' insert -(FIGS. 1 and 2)";
           line 49, after "120", insert --(FIGS. 1 and 2)--.
In Column 4, line 29, "Referring" should start new paragraph.
In Column 5, line 35, after "line" insert --162 to--;
           line 47, "100÷s" should be --100's--;
           line 68, after "may" insert --be--.
In Column 6, line 15, "251" should be --252--.
In Column 8, claim 4, line 1, after "claim" delete "2" insert --3--.
"         claim 6, line 4, "electrodes" should be --electrons--.

Signed and Sealed this

Twenty-ninth Day of March, 1994

Attest:

BRUCE LEHMAN

*Attesting Officer*      *Commissioner of Patents and Trademarks*